(12) United States Patent
Lee et al.

(10) Patent No.: US 11,825,727 B2
(45) Date of Patent: Nov. 21, 2023

(54) MASK, METHOD OF PROVIDING MASK, AND METHOD OF PROVIDING DISPLAY PANEL USING THE SAME

(71) Applicant: Samsung Display Co., Ltd., Yongin-si (KR)

(72) Inventors: Seul Lee, Hwaseong-si (KR); Minho Moon, Seongnam-si (KR); Youngmin Moon, Yongin-si (KR); Ji-Hee Son, Hwaseong-si (KR); Seungyong Song, Suwon-si (KR); Sungsoon Im, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 278 days.

(21) Appl. No.: 17/396,874

(22) Filed: Aug. 9, 2021

(65) Prior Publication Data
US 2022/0165997 A1     May 26, 2022

(30) Foreign Application Priority Data

Nov. 24, 2020   (KR) .................. 10-2020-0158486

(51) Int. Cl.
  *H10K 71/00*   (2023.01)
  *G03F 7/00*   (2006.01)
  (Continued)

(52) U.S. Cl.
  CPC .......... *H10K 71/00* (2023.02); *C23C 14/042* (2013.01); *C23C 16/042* (2013.01); *G03F 7/0015* (2013.01); *H10K 59/12* (2023.02)

(58) Field of Classification Search
  CPC ...... H10K 71/00; H10K 59/12; H10K 71/166; C23C 14/042; C23C 16/042; C23C 14/24;
  (Continued)

(56) References Cited

U.S. PATENT DOCUMENTS 11,075,340 B2 * 7/2021 Shin .................. C23F 4/00
2019/0084088 A1   3/2019 Takei et al.
(Continued)

FOREIGN PATENT DOCUMENTS

JP   4126648 B2   7/2008
JP   6359788 B2   7/2018

*Primary Examiner* — J. E. Schoenholtz
(74) *Attorney, Agent, or Firm* — CANTOR COLBURN LLP

(57) ABSTRACT

A method of providing a mask includes providing a first mask layer facing a second mask layer, in the second mask layer, providing a first opening which corresponds to a deposition opening of the mask, providing an auxiliary layer which faces the first mask layer with the second mask layer therebetween and covers the first opening, in the auxiliary layer, providing a second opening which corresponds to the first opening and exposes the first mask layer to outside the auxiliary layer, in the first mask layer, providing a third opening which corresponds to the first opening and the second opening by using the auxiliary layer as a mask and providing the auxiliary layer separated from the first mask layer and the second mask layer to provide the deposition mask having the first mask layer having the third opening and the second mask layer having the first opening.

20 Claims, 15 Drawing Sheets

(51) Int. Cl.
*C23C 16/04* (2006.01)
*C23C 14/04* (2006.01)
*H10K 59/12* (2023.01)

(58) Field of Classification Search
CPC ....... C23C 14/54; C23C 14/12; G03F 7/0015; G03F 7/0035; G03F 7/12
See application file for complete search history.

(56) References Cited

U.S. PATENT DOCUMENTS

2020/0020862 A1* 1/2020 Kishimoto ............. H10K 59/12
2021/0265602 A1* 8/2021 Sakio ................... C23C 14/042

* cited by examiner

MASK, METHOD OF PROVIDING MASK, AND METHOD OF PROVIDING DISPLAY PANEL USING THE SAME

This application claims priority to Korean Patent Application No. 10-2020-0158486, filed on Nov. 24, 2020, and all the benefits accruing therefrom under 35 U.S.C. § 119, the entire contents of which are hereby incorporated by reference.

BACKGROUND

(1) Field

The disclosure herein relates to a deposition mask having improved reliability, a method of providing the deposition mask, and a method of providing a display panel using the deposition mask.

(2) Description of the Related Art

Display panels may include a plurality of pixels. Each of the plurality of pixels may include a light emitting pattern disposed between facing electrodes. The light emitting pattern may be provided through various methods, and one of the methods may be a deposition method using a deposition mask. The light emitting pattern may be provided by using a deposition mask in which a through-portion is defined. The light emitting pattern may be provided to an area exposed through the through-portion. The shape of the light emitting pattern may be controlled according to the shape of the through-portion of the deposition mask.

SUMMARY

The disclosure provides a deposition mask having improved reliability with respect to a deposition process, a method of providing the same, and a method of providing a display panel by using the same.

An embodiment provides a method of providing a deposition mask, the method including providing a first mask layer, providing a second mask layer on the first mask layer, providing a first opening in the second mask layer, providing an auxiliary layer on the second mask layer to cover the first opening, providing a second opening in the auxiliary layer, providing a third opening in the first mask layer by using the second opening of the auxiliary layer, and providing the auxiliary layer separated from the first mask layer and the second mask layer.

In an embodiment, when viewed in a plan view, a size of the third opening provided in the first mask layer may be less than a size of the first opening provided in the second mask layer.

In an embodiment, a thickness of the auxiliary layer may be greater than a thickness of the second mask layer.

In an embodiment, a portion of one surface of the first mask layer may be exposed through the first opening of the second mask layer.

In an embodiment, the providing of the first opening in the second mask layer may include providing a first photoresist layer on the second mask layer, providing a first exposure mask above the first photoresist layer, providing a first photoresist pattern layer by patterning the first photoresist layer through the first exposure mask, and providing the first opening in the second mask layer by using the first photoresist pattern layer.

In an embodiment, the providing of the second opening in the auxiliary layer may include providing a second photoresist layer on the auxiliary layer, providing the first exposure mask above the second photoresist layer, providing a second photoresist pattern layer by patterning the second photoresist layer through the first exposure mask, and providing the second opening in the auxiliary layer by using the second photoresist pattern layer.

In an embodiment, the providing of the second opening in the auxiliary layer may include providing a second photoresist layer on the auxiliary layer, providing a second exposure mask above the second photoresist layer, providing a second photoresist pattern layer by patterning the second photoresist layer through the second exposure mask, and providing the second opening in the auxiliary layer by using the second photoresist pattern layer, where a surface area of a light transmitting area defined in the first exposure mask is greater than a surface area of a light transmitting area defined in the second exposure mask.

In an embodiment, a maximum width of the second opening of the auxiliary layer may be less than a maximum width of the first opening of the second mask layer.

In an embodiment, a side wall of the second mask layer, which defines the first opening, may surround a side wall of the first mask layer, which defines the third opening.

In an embodiment, a material constituting the second mask layer may be different from a material constituting the auxiliary layer.

In an embodiment, an exposure mask used in the providing of the first opening of the second mask layer may be the same as an exposure mask used in the providing of the second opening of the auxiliary layer.

In an embodiment, a portion of the auxiliary layer may overlap the third opening of the first mask layer.

In an embodiment, an area of the third opening of the first mask layer may be equal to or less than an area of the first opening of the second mask layer when viewed in a plan view, and the area of the third opening of the first mask layer may be greater than an area of the second opening of the auxiliary layer when viewed in a plan view.

In an embodiment, a side wall of the second mask layer, which defines the first opening, may be completely covered by the auxiliary layer.

In an embodiment, a method of manufacturing a display panel includes providing a mask in which a through-portion is defined, preparing a target substrate, providing the mask on the target substrate, providing a light emitting pattern on a light emitting area of the target substrate which corresponds to the through-portion, and removing the mask, where the providing of the mask includes providing a first mask layer, providing a second mask layer on the first mask layer, providing a first opening in the second mask layer, providing an auxiliary layer on the second mask layer to cover the first opening, providing a second opening in the auxiliary layer, providing a third opening in the first mask layer by using the second opening of the auxiliary layer, and removing the auxiliary layer, where an area of the third opening of the first mask layer is equal to or less than an area of the first opening of the second mask layer when viewed in a plan view, and the area of the third opening of the first mask layer is greater than an area of the second opening of the auxiliary layer when viewed in a plan view.

In an embodiment, a thickness of the auxiliary layer may be greater than a thickness of the second mask layer.

In an embodiment, an exposure mask used in the providing of the first opening of the second mask layer may be the same as an exposure mask used in the providing of the second opening of the auxiliary layer.

In an embodiment, the providing of the mask on the target substrate may include providing the mask so that the first mask layer is disposed between the target substrate and the second mask layer.

In an embodiment, a mask includes a first mask layer in which a first mask opening is defined, and a second mask layer in which is defined a second mask opening larger than the first mask opening, where the first mask layer includes polyimide, and the second mask layer includes titanium (Ti), titanium nitride ($TiN_x$), or molybdenum (Mo).

In an embodiment, each of the first mask layer and the second mask layer may be a fluorine-etched layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
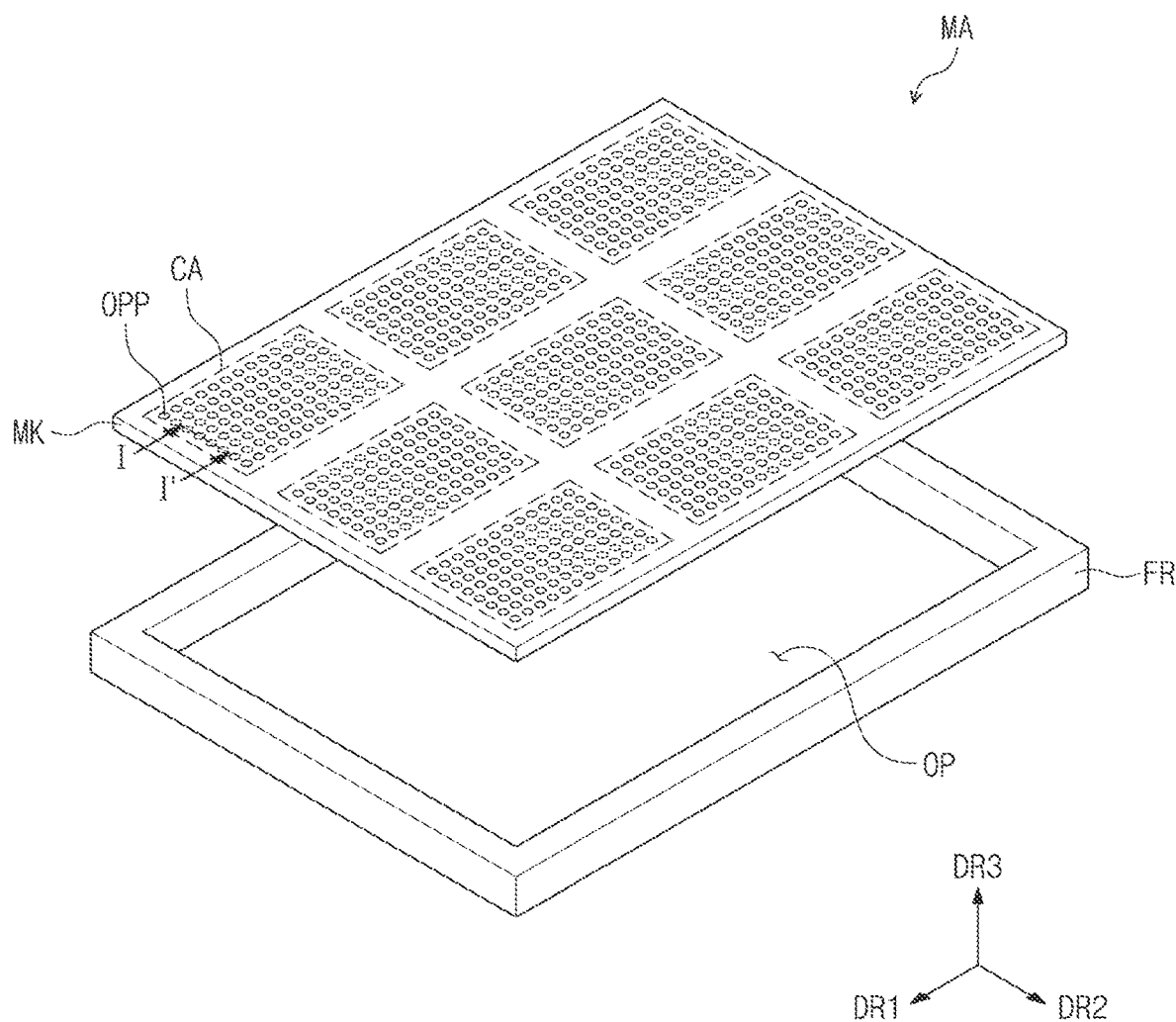
FIG. 1 is an exploded perspective view of an embodiment of a mask assembly.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the specification, it will be understood that when an element (or a region, a layer, a portion, or the like) is referred to as being related to another element such as being "on", "connected to" or "coupled to" another element, it can be directly on, connected or coupled to another element mentioned above, or intervening elements may be therebetween. In contrast, when an element (or a region, a layer, a portion, or the like) is referred to as being related to another element such as being "directly on", "directly connected to" or "directly coupled to" another element, no intervening element is therebetween.

Like numbers refer to like elements throughout. Also, in the drawings, the thicknesses, ratios, and dimensions of the elements are exaggerated for effective description of the technical contents.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the invention. The singular forms are intended to include the plural forms as well, unless the context clearly indicates otherwise.

Also, terms such as "below", "lower", "above", and "upper" may be used to describe the relationships of the components illustrated in the drawings. These terms have relative concepts and are described on the basis of the directions indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present disclosure belongs. Also, it will be further understood that terms, such as those defined in commonly used dictionaries, should be interpreted as having a meaning that is consistent with their dictionary-based meaning in the context of the relevant art and will not be interpreted in an idealized or overly formal sense unless expressly so defined herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the drawings.

FIG. 1 is an exploded perspective view of an embodiment of a mask assembly MA.

Referring to FIG. 1, a mask assembly MA may be used in a process for depositing a deposition material DM on a target. In an embodiment, the mask assembly MA may include a frame FR and a mask MK (e.g., deposition mask).

The top surface of each component is parallel to a plane defined by a first direction DR1 and a second direction DR2 which cross each other. The thickness direction of each component is indicated by a third direction DR3 crossing each of the first direction DR1 and the second direction DR2. The upper side (or upper portion) and the lower side (or lower portion) of each component are distinguished from each other along the third direction DR3. However, directions indicated as the first to third directions DR1, DR2, and DR3 have relative concepts and thus may be changed to other directions.

When viewed in a plan view, the frame FR may have a ring shape. That is, an opening portion OP may be provided in an area including the center of the frame FR. The opening portion OP may be a hole that passes through from the top surface of the frame FR to the bottom surface of the frame FR and is open at both the top surface of the frame FR and the bottom surface of the frame FR. Being viewed in a plan view may indicate a view along the third direction DR3. FIG. 1 illustratively shows a rectangular ring shape as an example of the planar shape of the frame FR, but the planar shape of the frame FR is not limited thereto. In an embodiment, for example, the frame FR may have various planar shapes such as a circular ring and a polygonal ring.

The frame FR is schematically illustrated as being disposed under the mask MK so as to support the mask MK in FIG. 1, but the invention is not limited thereto. The frame FR may be disposed both above and below edges of the mask MK, and supports the mask MK and extends the mask MK in the first direction DR1 and the second direction DR2.

The mask MK may include a cell area CA provided in plural including a plurality of cell areas CA which are arranged along the first direction DR1 and along the second direction DR2. In the embodiment, the cell areas CA are illustrated such that three cell areas are spaced apart from each other along each of the first direction DR1 and the second direction DR2, but this is illustrated as an example. In an embodiment, for example, the mask MK may include more of the cell areas CA than those illustrated in FIG. 1. Also, the cell areas CA may be arranged along only one of the first direction DR1 or the second direction DR2. Also, only of the one cell area CA may be provided corresponding to the mask MK, but the invention is not limited to any one embodiment.

The mask MK may have a plate shape extending along both the first direction DR1 and the second direction DR2. The mask MK may have an integrated plate shape so that the cell areas CA are connected to each other. In an embodiment, a portion of one of the cell areas CA (e.g., a first cell area) may extend to define another one of the cell areas CA (e.g., a second cell area adjacent to the first cell area).

The mask MK may include a first mask layer MK1 (see FIG. 2) including or made of a polymer material. Thus, the mask MK may not have a stick shape extending in any one of the first direction DR1 and the second direction DR2, but may have a plate shape extending in both the first direction DR1 and the second direction DR2 to correspond to a planar area of the frame FR. However, the invention is not limited thereto, and a mask MK may have a stick shape extending in any one of the first direction DR1 and the second direction DR2. In this case, a mask assembly MA may include the mask MK provided in plural including a plurality of masks, and the plurality of masks may be spaced apart from and/or disconnected from each other along the other of the first direction DR1 and the second direction DR2.

A through-portion OPP provided in plural including a plurality of through-portions OPP may be defined in each of the cell areas CA. The through-portion OPP may define a deposition opening or a deposition through-portion. The through-portions OPP may be spaced apart from each other along the first direction DR1 and along the second direction DR2. Each of the through-portions OPP may be defined as extending through the mask MK along the thickness direction (e.g., the third direction DR3) of the mask MK. Within a cell area CA, solid portions (e.g., first solid portions) of mask MK may alternate with through-portions OPP. Within the mask MK, the cell areas CA may alternate with solid portions (e.g., second solid portions).

Figure 2:
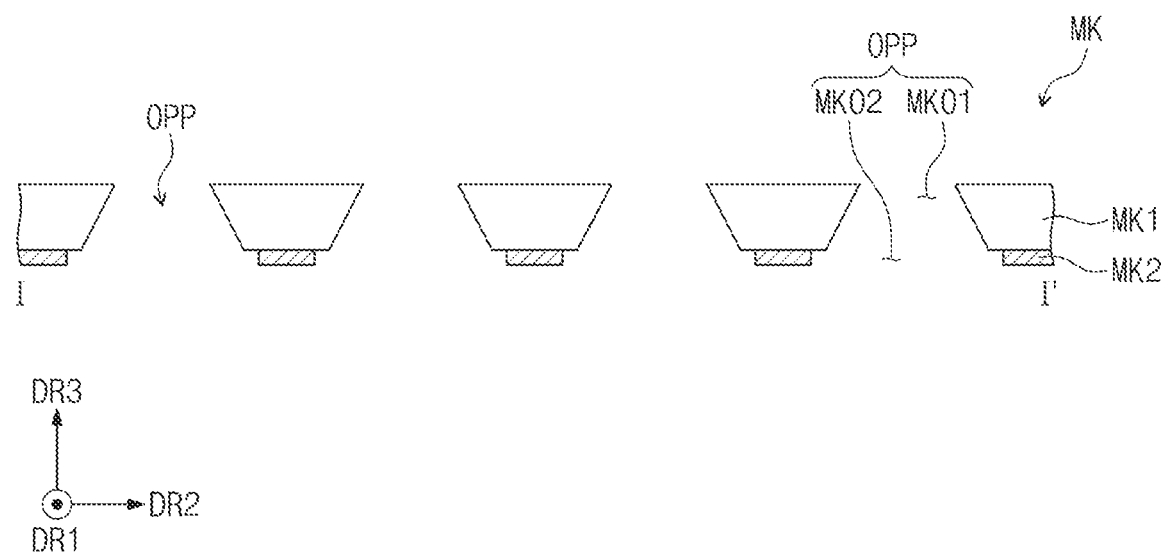
FIG. 2 is a cross-sectional view of an embodiment of a mask.

FIG. 2 is a cross-sectional view of an embodiment of a mask MK. FIG. 2 illustrates a cross-sectional view taken along line I-I' of FIG. 1.

Referring to FIGS. 1 and 2, the mask MK may include a first mask layer MK1 and a second mask layer MK2. The second mask layer MK2 may be disposed on one surface of the first mask layer MK1. The first mask layer MK1 may be referred to as a polymer material layer or a main mask layer, and the second mask layer MK2 may be referred to as an electrode layer.

At least one of the through-portion OPP may be defined in the mask MK. In an embodiment, for example, a plurality of through-portions OPP may be defined in the mask MK. The plurality of through-portions OPP may be spaced a certain distance from each other along the first direction DR1 and/or along the second direction DR2, and may form a certain pattern. Each of the plurality of through-portions OPP may be defined as extended through the mask MK along the third direction DR3. The plurality of through-portions OPP may be open at both a top surface of the mask MK and a bottom surface of the mask MK The first mask layer MK1 may define the top surface which is furthest from the frame FR and the second mask layer MK2 may define the bottom surface which is closest to the frame FR.

A first mask opening MKO1 may be defined in the first mask layer MK1, and a second mask opening MKO2 may be defined in the second mask layer MK2. The through-portion OPP may be defined by the first mask opening MKO1 together with the second mask opening MKO2. A size (e.g., dimension, area, width, planar area, surface area, etc.) of the second mask opening MKO2 may be greater than the size of the first mask opening MKO1. In an embodiment each of the first mask opening MKO1 and the second mask opening MKO2 has a first dimension along the first direction DR1, a second dimension along the second direction DR2 and a planar area defined by a product of the first dimension and the second dimension. When viewed along the thickness direction of the mask MK or in a plan view, or when viewed in a direction parallel to the third direction DR3, the planar area of the first mask opening MKO1 may be equal to or less than the planar area of the second mask opening MKO2. A solid portion of the second mask layer MK2 may be spaced apart from the first mask opening MKO1. That is, the first mask opening MKO1 may not be blocked by the second mask layer MK2. Accordingly, during a deposition process using the mask MK, a failure, in which a deposition material DM is not deposited on a target area due to the second mask layer MK2, may be removed.

The first mask layer MK1 may include a polymer material. In an embodiment, for example, the first mask layer MK1 may include polymer materials such as polyimide ("PI"), polycarbonate ("PC"), polyethylene naphthalene ("PEN"), or polyethylene terephthalate ("PET"), but the invention is not particularly limited thereto.

The second mask layer MK2 may include a material which is fixable to an electrostatic chuck. Being fixed to the electrostatic chuck may indicate that an attractive force is generated between the electrostatic chuck and the second mask layer MK2 such as at a solid portion thereof. The second mask layer MK2 may include metal, a metal alloy, or a transparent conductive oxide. In an embodiment, for example, the second mask layer MK2 may include at least one of conductive metals such as nickel (Ni), gold (Au), titanium (Ti), titanium nitride ($TiN_x$), and molybdenum (Mo), or conductive metal oxides such as an indium tin oxide ("ITO") and an indium zinc oxide ("IZO").

A thickness of the first mask layer MK1 may be determined by taking into consideration the durability and deposition precision of the mask MK. In an embodiment, for example, the thickness of the first mask layer MK1 may be about 5 micrometers (μm) to about 15 micrometers (μm), but the invention is not particularly limited thereto. The thickness of the second mask layer MK2 may be less than the thickness of the first mask layer MK1. In an embodiment, for example, the thickness of the second mask layer MK2 may be about 500 angstroms (Å) to about 1500 angstroms (Å), but the invention is not particularly limited thereto.

According to an embodiment, the mask MK may include the first mask layer MK1 that includes a polymer resin together with the second mask layer MK2 including a different material from the polymer resin. In this case, a thinner form of the mask MK when compared to a conventional mask provided entirely of an alloy such as Invar, and the costs and time in a process of providing the through-portion OPP or the like may be reduced. Also, the mask MK includes the second mask layer MK2 that includes a conductive material, and thus, the mask MK and a target substrate SUB may come into close contact with each other during a deposition process. Accordingly, shadow that occurs in the deposition process is reduced, and thus, a more precise deposition process may be performed.

Hereinafter, an embodiment of a method of providing or manufacturing a mask MK will be described. When describing the method of providing a mask MK according, the same reference symbols are given to components that are the same as those described above, and their detailed description will be omitted.

Figure 3:
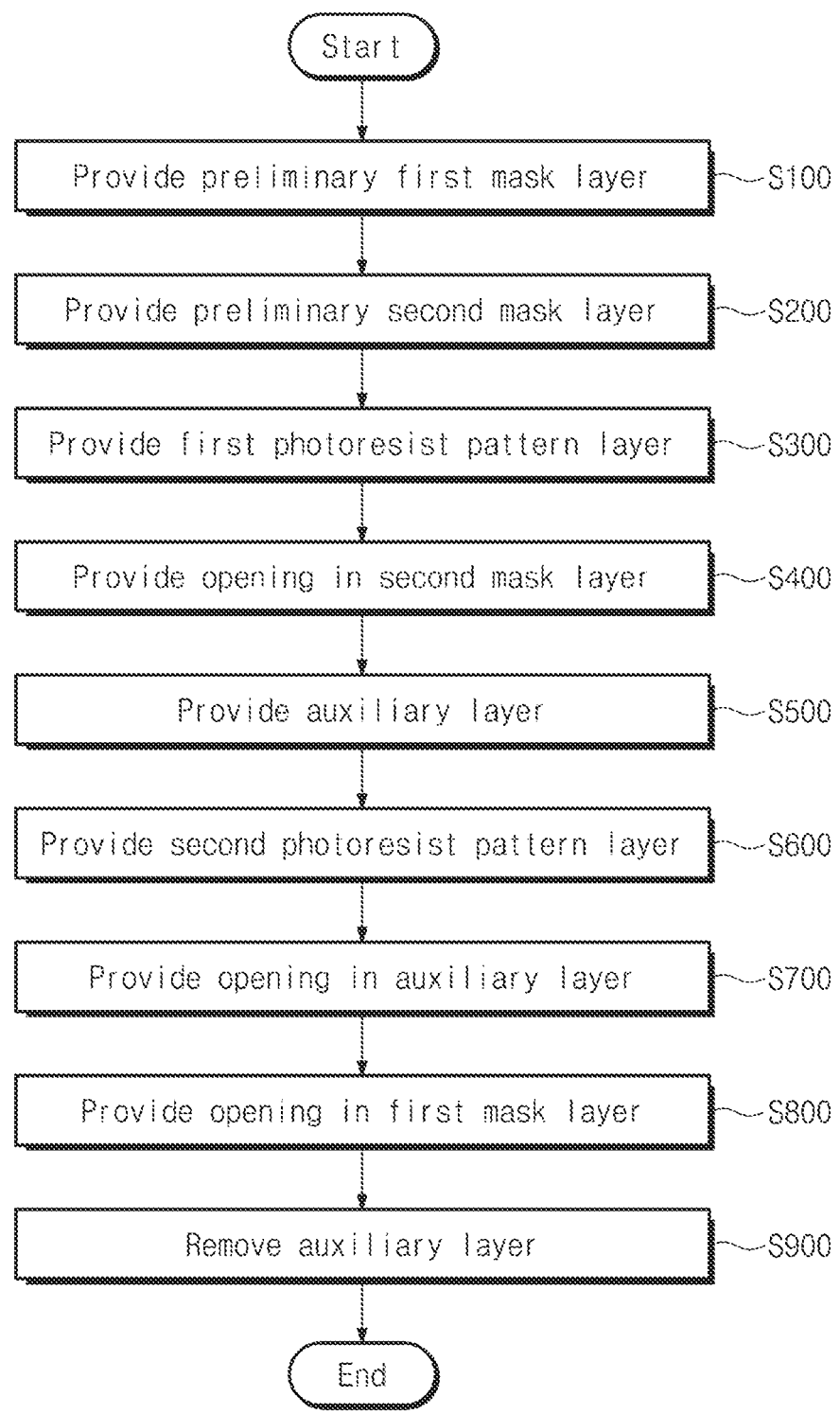
FIG. 3 is a flowchart showing an embodiment of a method of providing a mask.

FIG. 3 is a flowchart showing an embodiment of a method of providing a mask MK. FIGS. 4A to 4J are cross-sectional views showing an embodiment of a method of providing a mask MK.

Figure 4A:
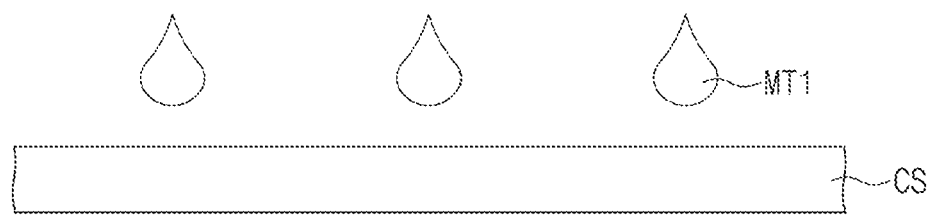
FIGS. 4A to 4J are cross-sectional views showing operations in an embodiment of a method of providing a mask.
Figure 4B:
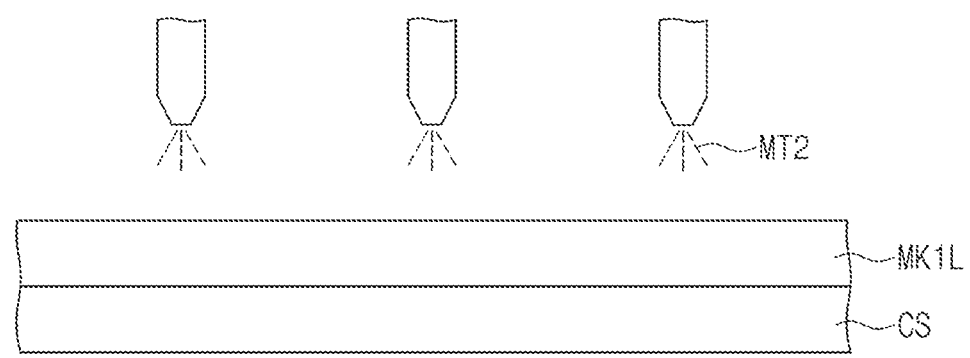

Referring to FIGS. 3, 4A, and 4B, a preliminary first mask layer MK1L may be provided or formed by coating a carrier substrate CS with a polymer resin MT1 (S100).

Figure 4C:
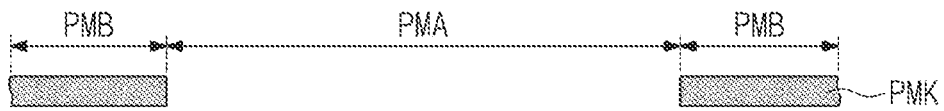
Figure 4C:
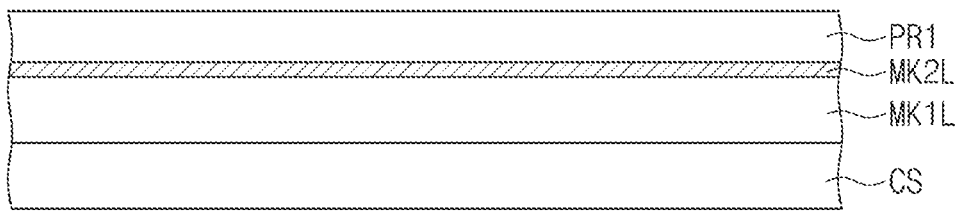

Referring to FIGS. 3, 4B, and 4C, a preliminary second mask layer MK2L is provided or formed by providing a conductive material MT2 onto one surface of the preliminary first mask layer MK1L (S200). The preliminary second mask layer MK2L may form an interface with the preliminary first mask layer MK1L. The preliminary first mask layer MK1L and the preliminary second mask layer MK2L are formed in order. The conductive material MT2 may be physically deposited, chemically deposited, or coated on the one surface of the preliminary first mask layer MK1L. In an embodiment, for example, the physical deposition may be a sputtering process, and the chemical deposition may be a chemical vapor deposition ("CVD") method or a plasma-enhanced chemical vapor deposition ("PECVD") method.

Subsequently, a first photoresist layer PR1 may be provided or formed on the preliminary second mask layer MK2L. A first exposure mask PMK is disposed above the first photoresist layer PR1 to pattern the first photoresist layer PR1. An exposure process may be performed in a state in which the first exposure mask PMK is disposed above the first photoresist layer PR1. The exposure process may include exposure by a light.

A light transmitting area PMA and a light blocking area PMB may be defined in the first exposure mask PMK. The light transmitting area PMA may have first transmittance, and the light blocking area PMB may have second transmittance. The second transmittance may be lower than the first transmittance. In an embodiment, for example, the first transmittance may be about 100 percent, and the second transmittance may be about 0 percent.

Figure 4D:
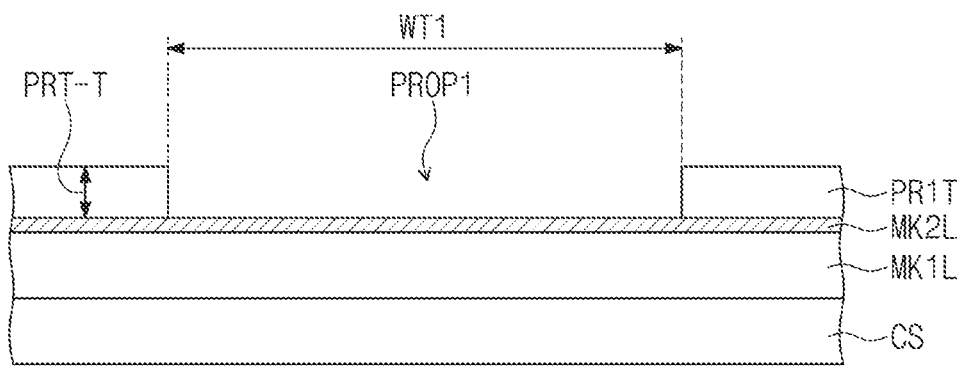

Referring to FIGS. 3, 4C, and 4D, the first photoresist layer PR1 of which the chemical properties has been changed due to light of the exposure process is removed through a development process, and thus, a first photoresist pattern layer PR1T is provided from the first photoresist layer PR1 (S300).

A first photo opening PROP1 may be defined in the first photoresist pattern layer PR1T. The first photo opening PROP1 may be provided or formed by removing a portion of the first photoresist layer PR1 that overlaps or corresponds to the light transmitting area PMA. The first photo opening PROP1 may be defined as extending through the first photoresist pattern layer PR1T from the top surface of the first photoresist pattern layer PR1T to the bottom surface of the first photoresist pattern layer PR1T.

Figure 4E:
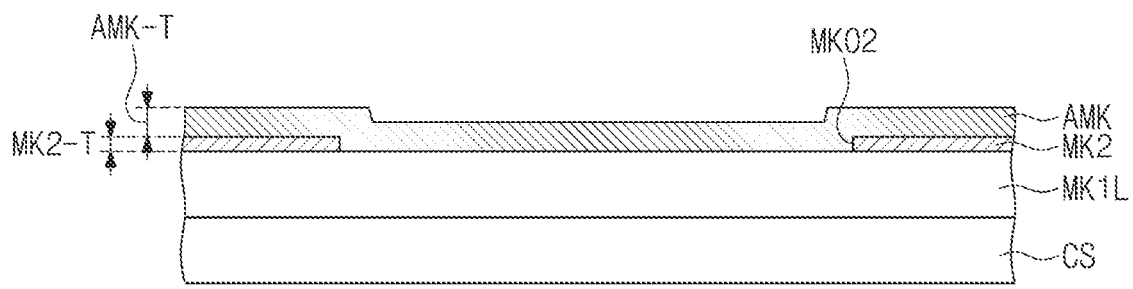

Referring to FIGS. 3, 4D, and 4E, a first opening corresponding to a second mask opening MKO2 is provided or formed in the preliminary second mask layer MK2L by using the first photoresist pattern layer PR1T as a mask, to provide the second mask layer MK2 having the second mask opening MKO2 (S400). A portion of the preliminary second mask layer MK2L, which is not covered by the first photoresist pattern layer PR1T, may be removed such as by an etch process. In an embodiment, for example, the portion of the preliminary second mask layer MK2L may be removed by a wet etching process, but the invention is not particularly limited thereto. The preliminary first mask layer MK1L is exposed to outside the second mask layer MK2 at the second mask opening MKO2.

An auxiliary layer AMK may be provided or formed on the second mask layer MK2 having the second mask opening MKO2 (S500). The auxiliary layer AMK may completely cover the second mask opening MKO2 of the second mask layer MK2. The auxiliary layer AMK may extend from the second mask opening MKO2, along a side wall M2S of the second mask layer MK2 and along a top surface of the second mask layer MK2. The auxiliary layer AMK may be referred to as an assist layer, a hard mask layer, or an intermediate mask layer.

A material of the auxiliary layer AMK may be different from a material of the second mask layer MK2. The auxiliary layer AMK may include aluminum (Al), copper (Cu), an indium tin oxide ("ITO"), or an indium zinc oxide ("IZO"). In an embodiment, for example, when the auxiliary layer AMK includes or is made of the indium tin oxide, the second mask layer MK2 does not include or is not made of the indium tin oxide.

Since the auxiliary layer AMK has to sufficiently cover the second mask opening MKO2 provided in the second mask layer MK2, a thickness AMK-T of the auxiliary layer AMK may be equal to or greater than a thickness MK2-T of the second mask layer MK2. In an embodiment, for example, the thickness AMK-T of the auxiliary layer AMK may be two times the thickness MK2-T of the second mask layer MK2, but the invention is not particularly limited thereto. Also, the auxiliary layer AMK may be used as a hard mask in a process of patterning the preliminary first mask layer MK1L. Thus, the thickness AMK-T of the auxiliary layer AMK may be large enough to be used as the hard mask. In an embodiment, for example, the thickness AMK-T of the auxiliary layer AMK may be about 2000 angstroms (Å), but the invention is not particularly limited thereto.

Figure 4F:
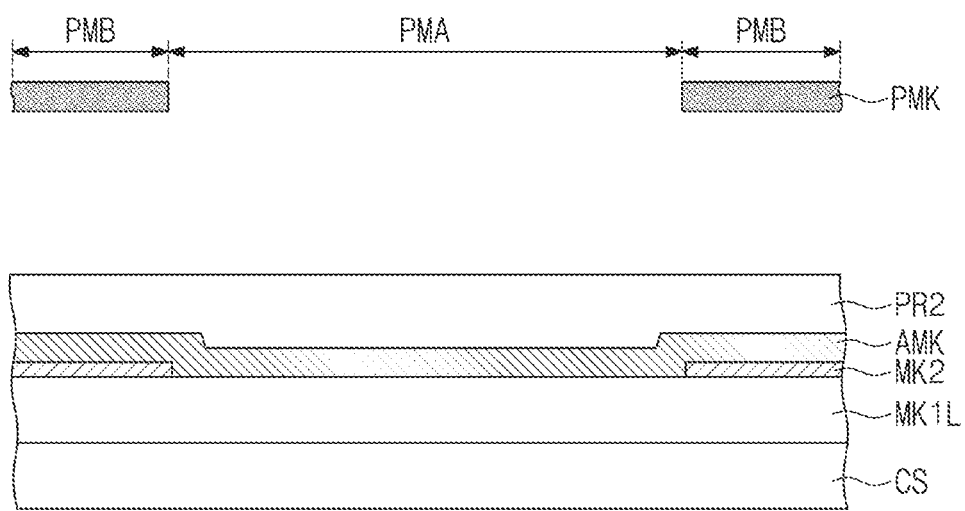
Figure 4G:
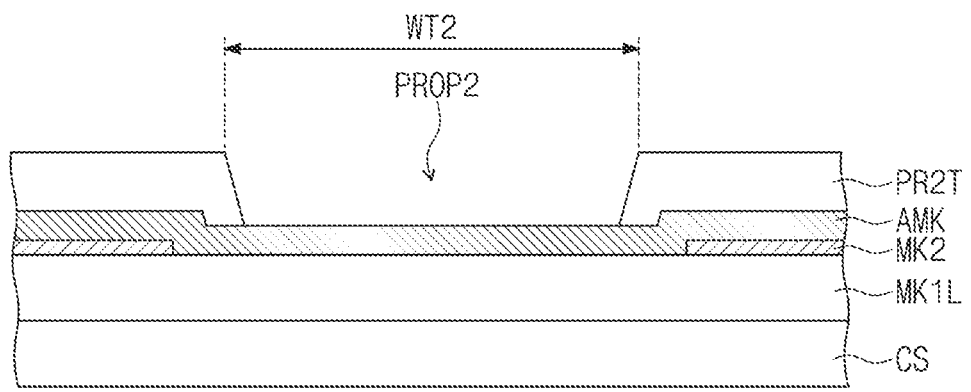

Referring to FIGS. 3, 4F, and 4G, a second photoresist layer PR2 is provided or formed on the auxiliary layer AMK. A first exposure mask PMK is disposed above the second photoresist layer PR2 to pattern the second photoresist layer PR2. An exposure process may be performed in a state in which the first exposure mask PMK is disposed above the second photoresist layer PR2.

The second photoresist layer PR2 of which the chemical properties has been changed due to light of the exposure process is removed through a development process, and thus, a second photoresist pattern layer PR2T is provided (S600). A second photo opening PROP2 may be defined in the second photoresist pattern layer PR2T. A maximum width WT2 of the second photo opening PROP2 may be less than a maximum width WT1 of the first photo opening PROP1 (see FIG. 4D).

The first exposure mask PMK used when the second photoresist layer PR2 is patterned may be the same as the first exposure mask PMK used when the first photoresist layer PR1 (see FIG. 4C) is patterned. The exposure amount, exposure time, or exposure intensity may be controlled so that the second photo opening PROP2 become smaller than the first photo opening PROP1 (see FIG. 4D). Alternatively, the material of the second photoresist layer PR2 may include a material different from the material of the first photoresist layer PR1 (see FIG. 4C).

Figure 4H:
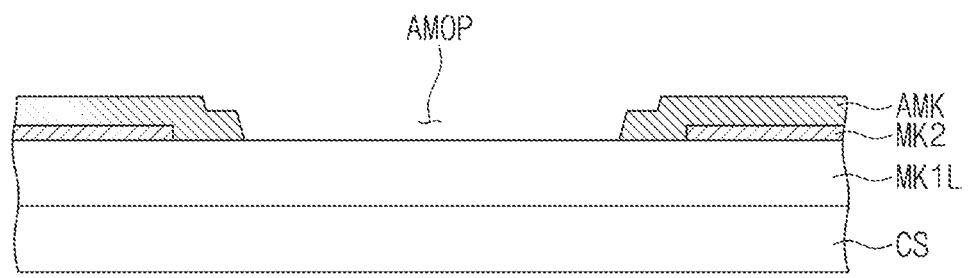

Referring to FIGS. 3, 4G, and 4H, a second opening AMOP (or an auxiliary opening) may be provided or formed in the auxiliary layer AMK by using the second photoresist pattern layer PR2T as a mask (S700). A portion of the auxiliary layer AMK, which is not covered by the second photoresist pattern layer PR2T, may be removed by an etch process. In an embodiment, for example, the portion of the auxiliary layer AMK may be removed by a wet etching process, but the invention is not particularly limited thereto.

Figure 4I:
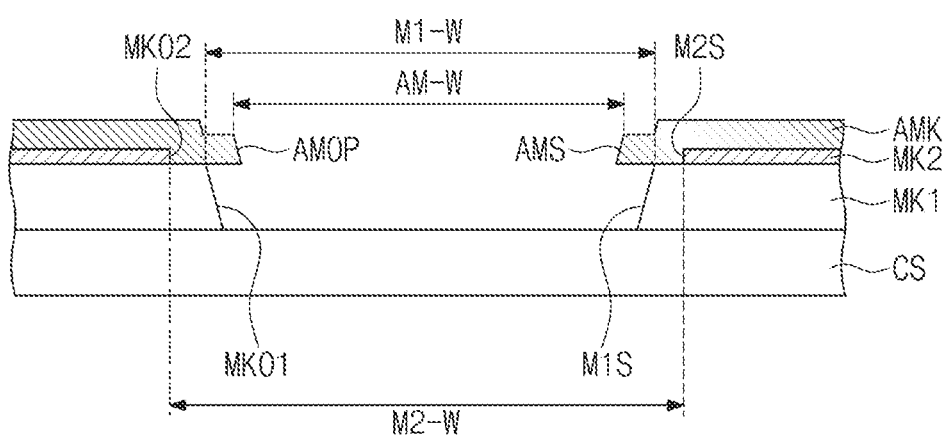

Referring to FIGS. 3, 4H, and 4I, a portion of the preliminary first mask layer MK1L may be exposed to outside the auxiliary layer AMK by the second opening AMOP. The etch process may be performed to the exposed portion of the preliminary first mask layer MK1L by using the auxiliary layer AMK as a mask. In an embodiment, for example, the portion of the preliminary first mask layer MK1L may be removed by a dry etching process, but the invention is not particularly limited thereto. The portion of the preliminary first mask layer MK1L is etched, and thus, a third opening corresponding to a first mask opening MKO1 may be provided (S800).

According to one or more embodiment, when the first mask opening MKO1 is provided in the preliminary first mask layer MK1L, the second mask layer MK2 may be completely covered by the auxiliary layer AMK. A side wall M2S of the second mask layer MK2, which defines the second mask opening MKO2, may be completely covered by the auxiliary layer AMK. Thus, the material of the second mask layer MK2 may be selected without taking into consideration the etch selectivity with respect to the process of patterning the auxiliary layer AMK. That is, the degree of freedom in selecting a material for the second mask layer MK2 may increase.

In an embodiment, for example, in a case where the preliminary first mask layer MK1L includes polyimide, a fluorine-based material may be used when the preliminary first mask layer MK1L is etched. Since the second mask layer MK2 is completely covered by the auxiliary layer AMK, various materials may be selected without being limited to a material resistant to the fluorine. In an embodiment, for example, titanium (Ti), titanium nitride (TiN$_x$), or molybdenum (Mo), which is etched by the fluorine-based material, may be used for the second mask layer MK2.

A material resistant to the fluorine may be selected for the auxiliary layer AMK. Since the auxiliary layer AMK is a layer which is not included in the mask MK (see FIG. 4J), a material having relatively low flexibility may be selected for the auxiliary layer AMK. That is, various materials may be selected for the material of the auxiliary layer AMK as long as the material is resistant to the material that etches the preliminary first mask layer MK1L. In an embodiment, for example, the auxiliary layer AMK may include indium zinc oxide or aluminum (Al).

FIG. 4I illustrates a maximum width M2-W of the second mask opening MKO2, a maximum width AM-W of the second opening AMOP, and a maximum width M1-W of the first mask opening MKO1. The maximum width M2-W of the second mask opening MKO2 may be greater than the maximum width AM-W of the second opening AMOP. The maximum width M2-W of the second mask opening MKO2 may be equal to or greater than the maximum width M1-W of the first mask opening MKO1. The maximum width M1-W of the first mask opening MKO1 may be greater than the maximum width AM-W of the second opening AMOP. Thus, a portion of the auxiliary layer AMK (e.g., protruding tip portion) may extend further than a side wall M1S of the first mask layer MK1 to overlap or extend into the first mask opening MKO1 of the first mask layer MK1.

When viewed in a plan view, the side wall M2S of the second mask layer MK2, which defines the second mask opening MKO2, may overlap both the auxiliary layer AMK and the first mask layer MK1. When viewed in a plan view, a side wall AMS of the auxiliary layer AMK, which defines the second opening AMOP, may overlap neither the first mask layer MK1 nor the second mask layer MK2. In an embodiment, for example, the side wall AMS of the auxiliary layer AMK may overlap both the second mask opening MKO2 and the first mask opening MKO1. When viewed in a plan view, a side wall M1S of the first mask layer MK1, which defines the first mask opening MKO1, may overlap the auxiliary layer AMK but may not overlap the second mask layer MK2. When viewed in a plan view, the side wall M2S of the second mask layer MK2 may surround the side wall M1S of the first mask layer MK1 which defines the first mask opening MKO1.

Figure 4J:
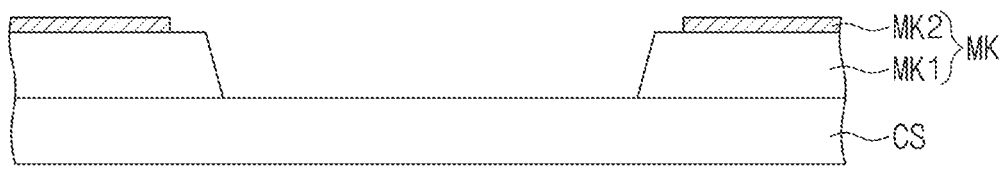

Referring to FIGS. 3, 4I, and 4J, the auxiliary layer AMK may be removed such as through an etch process (S900). In an embodiment, for example, the auxiliary layer AMK may be removed by a wet etching process, but the invention is not particularly limited thereto. Subsequently, the mask MK is separated from the carrier substrate CS to provide the mask MK. The mask MK may be coupled to the frame FR (see FIG. 1).

According to one or more embodiment of the invention, the auxiliary layer AMK including a protruding tip portion overlapping the first mask opening MKO1 may be completely removed. Thus, the deposition precision and deposition reliability may be improved upon the deposition process in which the mask MK is used.

Figure 5:
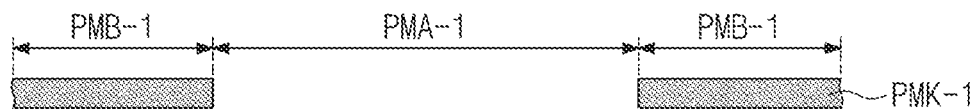
FIG. 5 is a cross-sectional view showing an embodiment of a method of providing a mask.
Figure 5:
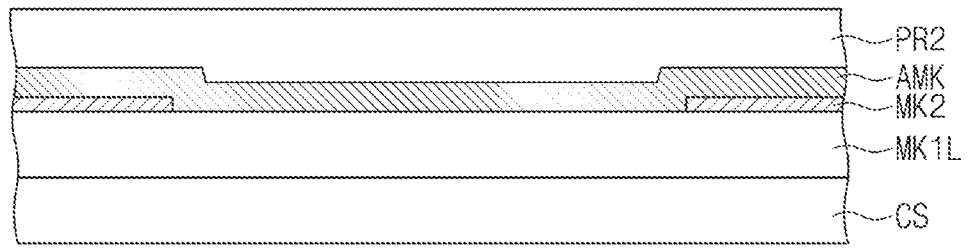

FIG. 5 is a cross-sectional view showing an embodiment of a method of providing a mask MK. For example, FIG. 5 may be a cross-sectional view showing an operation corresponding to that of FIG. 4F. In describing FIG. 5, the differences from the components of FIG. 4F will be described.

Referring to FIG. 5, the second photoresist layer PR2 is provided or formed on the auxiliary layer AMK. A second exposure mask PMK-1 may be disposed above the second photoresist layer PR2. The second exposure mask PMK-1 may be an exposure mask different from the first exposure mask PMK illustrated above in FIG. 4C.

A light transmitting area PMA-1 and a light blocking area PMB-1 may be defined in the second exposure mask PMK-1. The planar area of the light transmitting area PMA-1 defined in the second exposure mask PMK-1 may be less than the planar area of the light transmitting area PMA (see FIG. 4C) defined in the first exposure mask PMK. The solid portion of the second exposure mask PMK-1 extends further than a side wall M2S of the second mask layer MK2 and into the second mask opening MKO2.

Figure 6:
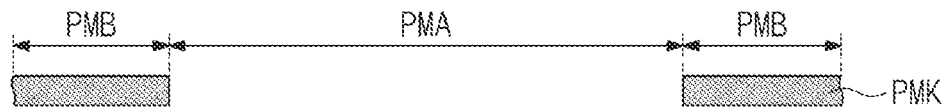
FIG. 6 is a cross-sectional view showing an embodiment of a method of providing a mask.
Figure 6:
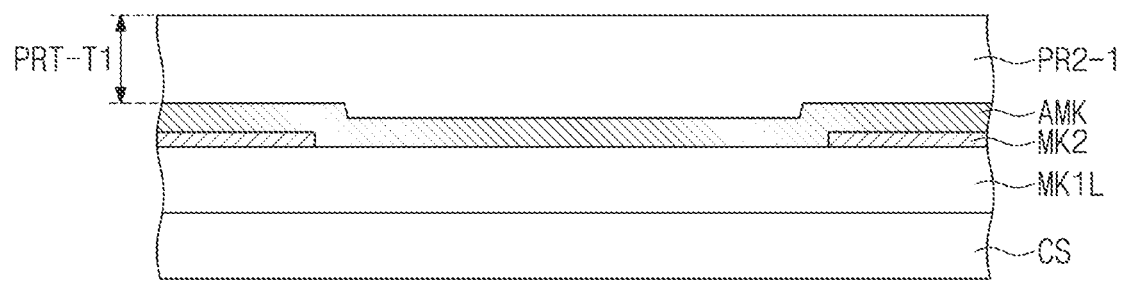

FIG. 6 is a cross-sectional view showing an embodiment of a method of providing a mask MK. In an embodiment, for example, FIG. 6 may be a cross-sectional view showing an operation corresponding to that of FIG. 4F. In describing FIG. 6, the differences from the components of FIG. 4F will be described.

Referring to FIG. 6, a second photoresist layer PR2-1 is provided or formed on the auxiliary layer AMK. A first exposure mask PMK is disposed above the second photoresist layer PR2-1. The first exposure mask PMK may be the same mask as the first exposure mask PMK illustrated in FIG. 4C.

The size of the second photo opening PROP2 (see FIG. 4G) which is to be provided in the second photoresist layer PR2-1 is less than the size of the first photo opening PROP1 (see FIG. 4D) which is provided in the first photoresist layer PR1 (see FIG. 4C).

Since a size of the second photo opening PROP2 in the second photoresist layer PR2-1 is less than the size of the first photo opening PROP1 using the same mask (e.g., first exposure mask PMK), a thickness PRT-T1 of the second photoresist layer PR2-1 may be greater than a thickness PRT-T of the first photoresist pattern layer PR1T illustrated in FIG. 4D.

Figure 7:
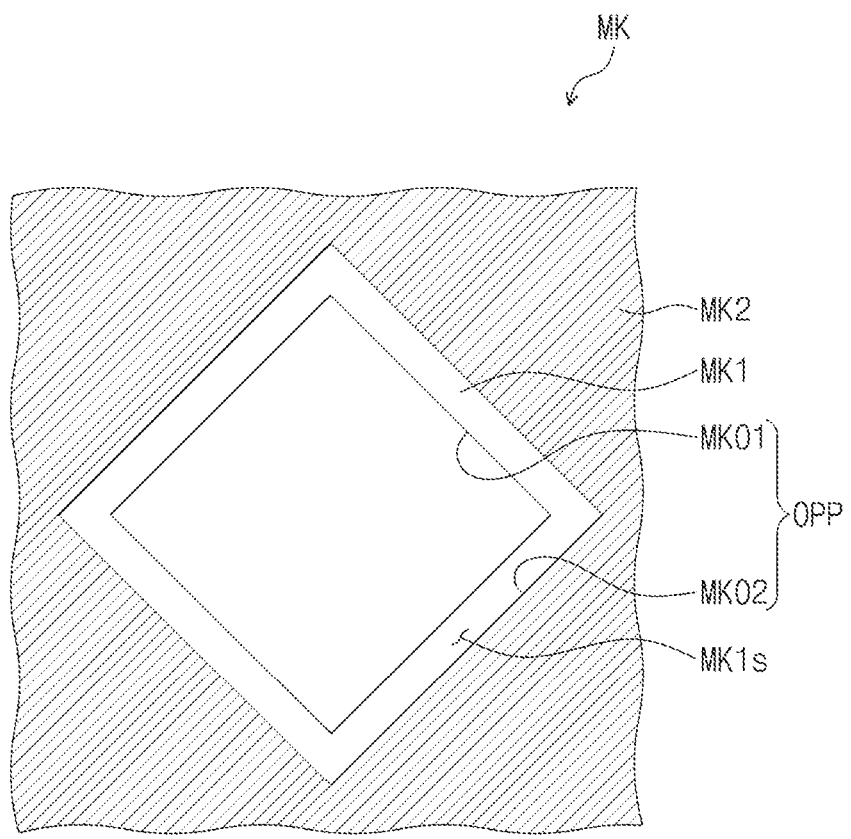
FIG. 7 is a rear view illustrating an embodiment of a mask.

FIG. 7 is a rear view illustrating an embodiment of a mask MK.

Referring to FIG. 7, when viewed in a plan view, a mask MK may include a first mask layer MK1 and a second mask layer MK2. A through-portion OPP may include a first mask opening MKO1 defined in the first mask layer MK1 and a second mask opening MKO2 defined in the second mask layer MK2. The first mask opening MKO1 and the second mask opening MKO2 may be aligned with each other to define the through-portion OPP. When viewed in a plan view, the planar size of the first mask opening MKO1 may be less than the planar size of the second mask opening MKO2. Thus, a portion of the first mask layer MK1 may not be covered by the second mask layer MK2. A portion of the first mask layer MK1 may be exposed outside of the second mask layer MK2. In an embodiment, for example, a portion MK1s of a rear surface of the first mask layer MK1 may be exposed to outside of the second mask layer MK2 through the second mask opening MKO2.

Figure 8:
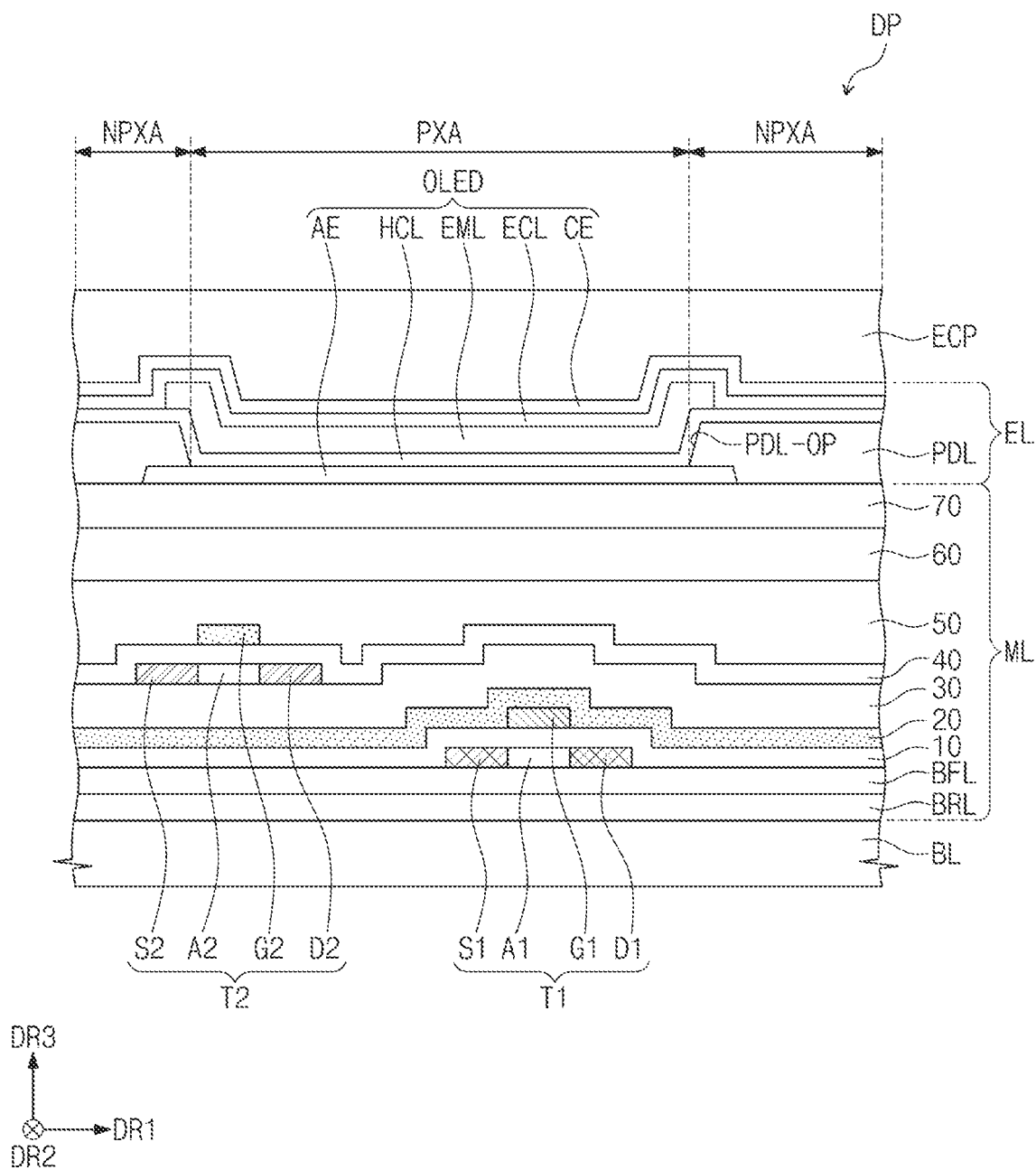
FIG. 8 is a cross-sectional view of an embodiment of a display panel.

FIG. 8 is a cross-sectional view of an embodiment of a display panel DP.

Referring to FIG. 8, a display panel DP may be a light emitting display panel. FIG. 8 illustrates a cross-section corresponding to one of a plurality of pixels, and illustrates a cross-section corresponding to two transistors T1 and T2 and a light emitting element OLED of a pixel. The light emitting element OLED may be an organic light emitting element.

As illustrated in FIG. 8, the display panel DP may include a base layer BL, a circuit element layer ML disposed on the base layer BL, a display element layer EL disposed on the circuit element layer ML, and an encapsulation layer ECP disposed on the display element layer EL.

The base layer BL may include a glass substrate or a synthetic resin layer. The base layer BL may be provided or formed of a synthetic resin layer on a support substrate used in manufacturing the display panel DP, providing or forming a conductive layer, an insulating layer and the like on the synthetic resin layer, and then removing the support substrate.

The circuit element layer ML may include at least one insulating layer and a circuit element. The circuit element includes a signal line, a driving circuit of a pixel, or the like. The circuit element layer ML may be provided or formed through a process of forming an insulating layer, a semiconductor layer and a conductive layer using coating, deposition, or the like and a process of patterning the insulating layer, the semiconductor layer, and the conductive layer using a photolithography process.

In the embodiment, the circuit element layer ML may include a buffer layer BFL, a barrier layer BRL, and first to seventh insulating layers 10 to 70. Each of the buffer layer BFL, the barrier layer BRL, and the first to seventh insulating layers 10 to 70 may include one of an inorganic layer and an organic layer. Each of the buffer layer BFL and the barrier layer BRL may include an inorganic layer. At least one of the fifth to seventh layers 50, 60, and 70 may include an organic layer.

FIG. 8 illustratively shows the arrangement relationship of a first active portion A1, a second active portion A2, a first gate G1, second gate G2, a first source S1, a second source S2, a first drain D1, and a second drain D2 of the first and second transistors T1 and T2. In the embodiment, the first active portion A1 and the second active portion A2 may include different materials. In an embodiment, for example, the first active portion A1 may include a polysilicon semiconductor, and the second active portion A2 may include a metal oxide semiconductor. Each of the first source S1 and the first drain D1 correspond to an area having higher doping concentration than the first active portion A1, and serves as an electrode. Each of the second source S2 and the second drain D2 corresponds to an area in which the metal oxide semiconductor is reduced, and serves as an electrode.

In an embodiment, the first active portion A1 and the second active portion A2 may include the same semiconductor material. In this case, the second transistor T2 may have the same stack structure as the first transistor T1, and the stack structure of the circuit element layer ML may be further simplified.

The display element layer EL include a pixel defining layer PDL and the light emitting element OLED. The light emitting element OLED may be an organic light emitting diode or a quantum dot light emitting diode. An anode AE is disposed on the seventh insulating layer 70. At least a portion of the anode AE is exposed through a pixel opening PDL-OP of the pixel defining layer PDL. The pixel opening PDL-OP of the pixel defining layer PDL may define a light emitting area PXA. A non-light emitting area NPXA may be adjacent to the light emitting area PXA, such as to surround the light emitting area PXA without being limited thereto.

A hole control layer HCL and an electron control layer ECL may be commonly disposed over the light emitting area PXA and the non-light emitting area NPXA. A light emitting pattern EML may be provided in the form of a discrete shape (e.g., pattern) to correspond to the pixel opening PDL-OP. The light emitting pattern EML may be deposited in a method different from a method of depositing the hole control layer HCL and the electron control layer ECL having the form of a film. The hole control layer HCL and the electron control layer ECL may be commonly provided or formed over the plurality of pixels by using an open mask. The light emitting pattern EML may be provided or formed in the form of pattern to correspond to the pixel opening PDL-OP, by using one or more embodiment of the mask MK. The light emitting pattern EML may be a deposition pattern which is provided by using the mask MK. That is, the through-portion OPP of the mask MK may correspond to the deposition pattern in planar shape, dimension, etc. However, the invention is not limited thereto. Like the light emitting pattern EML, the hole control layer HCL and the electron control layer ECL may also be provided or formed in the form of pattern to correspond to the pixel opening PDL-OP, by using one or more embodiment of the mask MK.

A cathode CE may be disposed on the electron control layer ECL. The encapsulation layer ECP may be disposed on the cathode CE. The encapsulation layer ECP may be a thin film encapsulation ("TFE") layer for encapsulating the display element layer EL. The encapsulation layer ECP may include a plurality of thin films. The plurality of thin films may include an inorganic layer and an organic layer. The encapsulation layer ECP may include an insulating layer for encapsulating the display element layer EL and a plurality of insulating layers for improving the light emitting efficiency.

Figure 9:
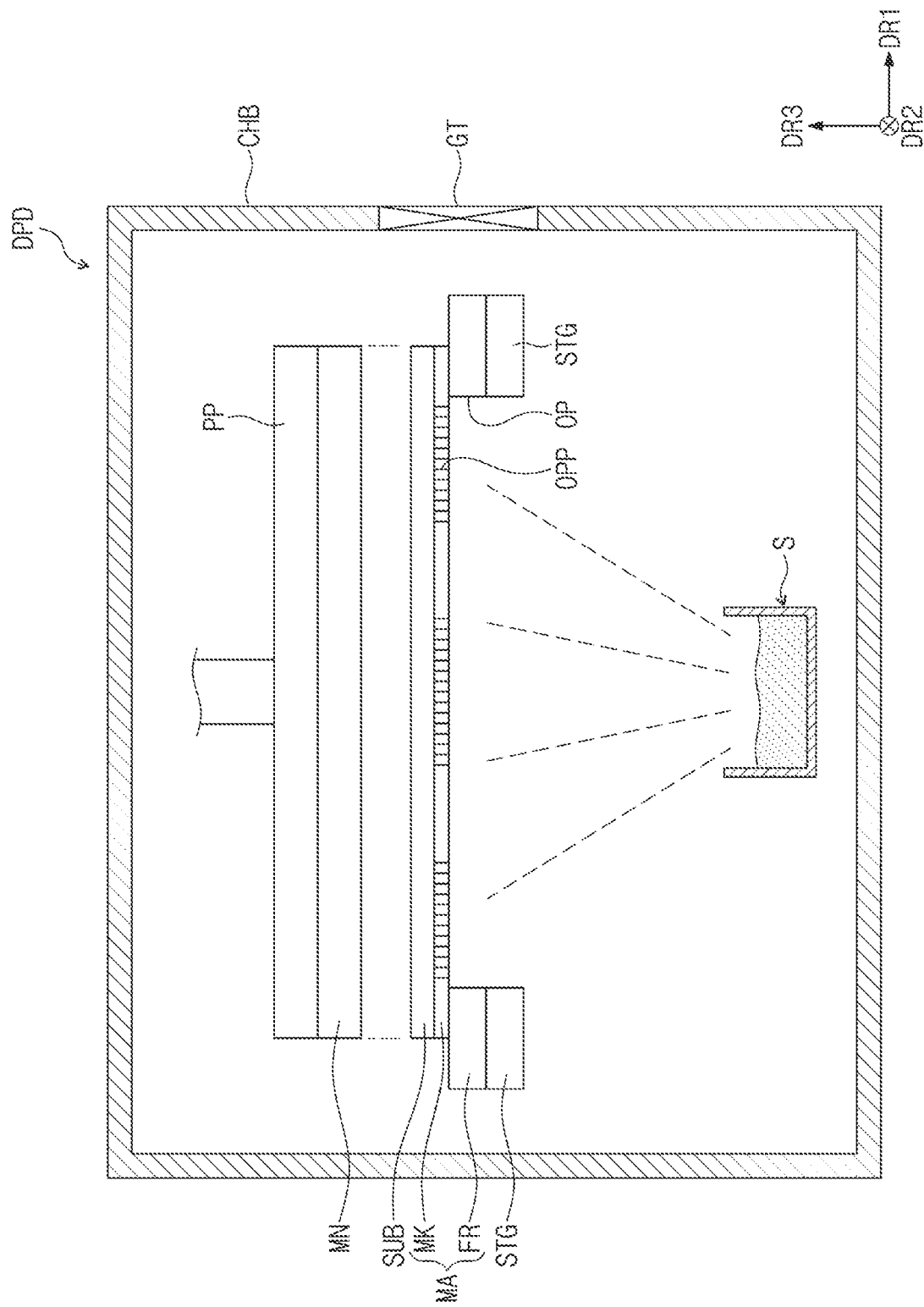
FIG. 9 is a cross-sectional view of an embodiment of a deposition device.

FIG. 9 is a cross-sectional view of an embodiment of a deposition device DPD.

Referring to FIG. 9, a deposition device DPD may include a chamber CHB (e.g., deposition chamber), a deposition source S, a stage STG, a moving plate PP, and a mask assembly MA.

The chamber CHB provides a sealed space in which deposition is performed (e.g., deposition space). The deposition source S, the stage STG, the moving plate PP, and the mask assembly MA may be disposed within the chamber CHB. The chamber CHB may include at least one gate GT. The chamber CHB may be opened and closed by the gate GT. A target substrate SUB may enter and exit the chamber CHB through the gate GT provided in the chamber CHB.

The deposition source S includes a deposition material DM. Here, the deposition material DM may be a material which is sublimated or vaporized, and may include one or more of an inorganic substance, metal, or an organic substance. The deposition source S is illustratively described as a case including the organic substance for providing the light emitting element OLED (see FIG. 8).

The stage STG is disposed above the deposition source S. The mask assembly MA may be placed on the stage STG. The mask assembly MA may face the deposition source S with the stage STG therebetween. The stage STG may overlap a frame FR of the mask assembly MA and thus may support the mask assembly MA. The stage STG does not overlap an opening portion OP of the frame FR. That is, the stage STG may be disposed outside of a moving path of the deposition material DM which is supplied from the deposition source S to the target substrate SUB.

The target substrate SUB is disposed on the mask assembly MA. The target substrate SUB faces the deposition source S with the mask assembly MA therebetween. The deposition material DM passes through a plurality of through-portions OPP of the mask MK and is deposited on the target substrate SUB.

The moving plate PP may allow the target substrate SUB to be aligned on the mask assembly MA. The moving plate PP may be moveable in the up-down or left-right direction. A magnetic body MN is disposed on the moving plate PP and may be moveable together with the moving plate PP. Thus, the target substrate SUB may be moved by a magnetic force. Also, the magnetic body MN may generate the magnetic force to contact a mask MK with a lower portion of the target substrate SUB, and accordingly the precision of the deposition process may be further enhanced.

Figure 10:
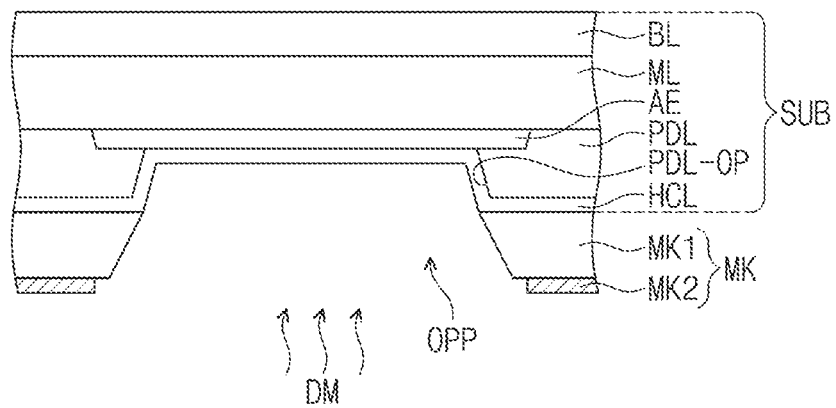
FIG. 10 is an enlarged cross-sectional view illustrating an embodiment of portions of a target substrate relative to a mask.

FIG. 10 is an enlarged cross-sectional view illustrating portions of a target substrate SUB relative to a mask MK.

Referring to FIGS. 8, 9, and 10, the light emitting pattern EML may be provided in the form of pattern (e.g., discrete shape) through the mask MK to correspond to the pixel opening PDL-OP. More particularly, in a method of providing a deposition pattern using one or more embodiment of the mask MK, the light emitting pattern EML may be provided in plural including a plurality of light emitting patterns EML within the deposition device DPD by patterning a deposition material DM, which is deposited upward from the deposition source S, through the mask MK to correspond to the inside of the pixel opening PDL-OP. That is, the first mask opening MKO1 of the first mask layer MK1 is the third opening described above through which deposition material DM exits the deposition mask. In the patterning of the light emitting pattern EML, the mask MK may be brought into contact with the target substrate SUB by the magnetic body MN included in the deposition device DPD.

Figure 11A:
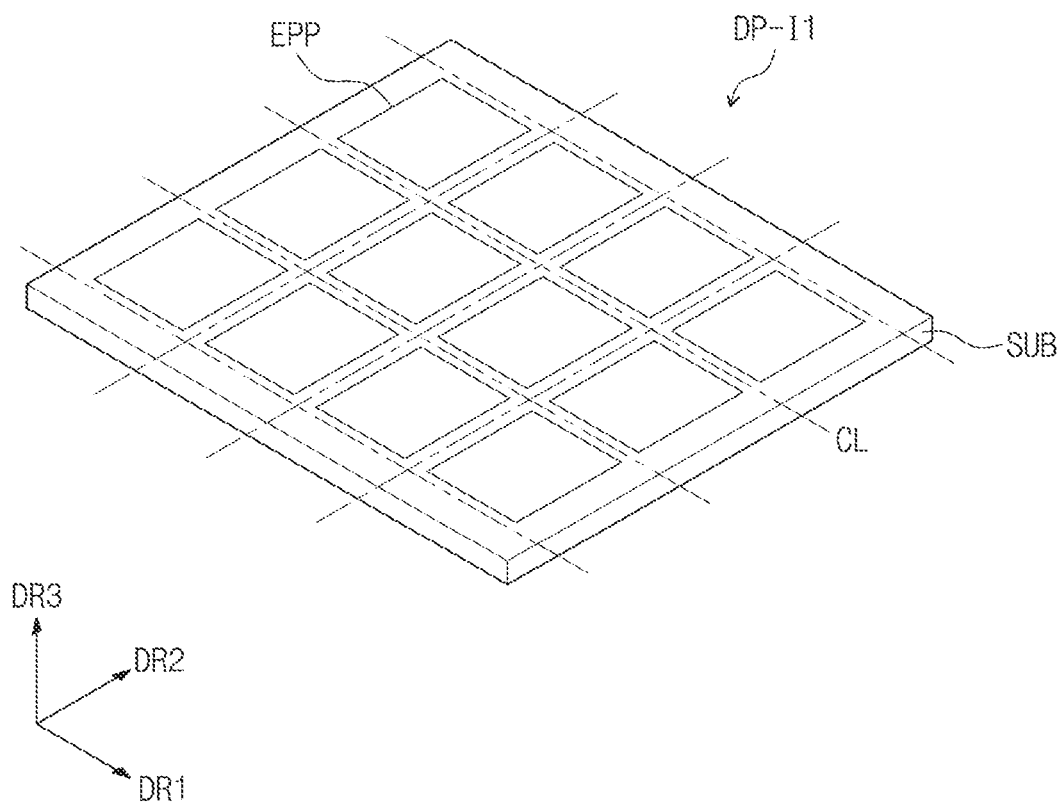
FIGS. 11A and 11B are cross-sectional views showing operations in an embodiment of a method of providing a display panel.
Figure 11B:
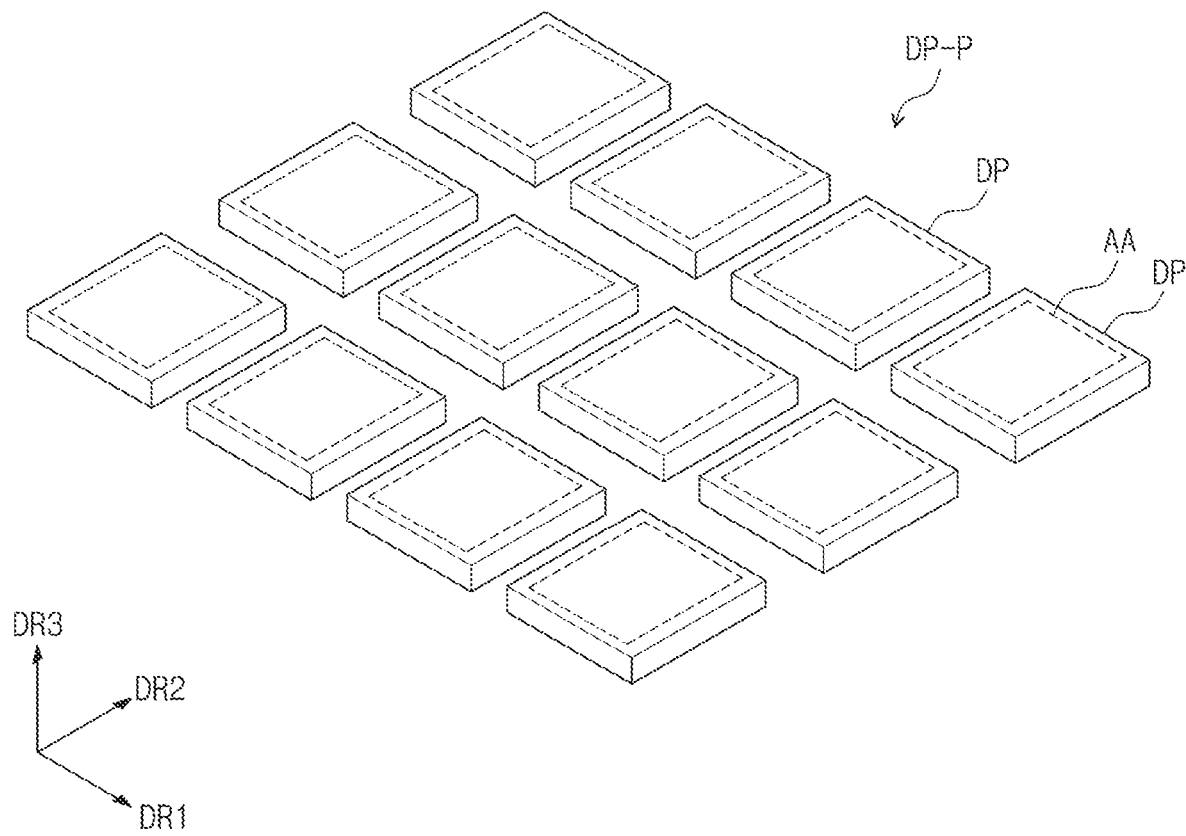

FIGS. 11A and 11B are cross-sectional views showing embodiments of operations in a method of providing a display panel DP.

Referring to FIGS. 1, 9, 11A, and 11B, after the deposition material DM is deposited on the target substrate SUB in a preliminary form or mother substrate form by the deposition device DPD, the mask assembly MA may be removed from the target substrate SUB. An initial substrate DP-I1 from which the mask assembly MA has been removed is in a state in which light emitting pattern layers EPP (e.g., deposition patterns) are provided on the target substrate SUB. The light emitting pattern layers EPP may be provided or formed respectively corresponding to the cell areas CA of the mask MK. Each of the light emitting pattern layers EPP may include a plurality of light emitting patterns EML (see FIG. 8) which are not shown herein.

Subsequently, the initial substrate DP-I1 may be cut along a cutting line CL provided in plural including a plurality of cutting lines CL and divided into a plurality of display panels DP-P. A display panel DP corresponds to or is formed by each of the display panels DP-P. The display panel DP may include an active area AA. The active area AA may include a plurality of pixels. The active area AA may correspond to an area in which the light emitting pattern layer EPP is disposed.

According to one or more embodiment, the plurality of display panels DP-P may be provided or formed by patterning one of the initial substrate DP-I1. Also, since the mask MK with which the display panel DP is provided includes the layer including the polymer material such as polyimide ("PI"), a large mask process suitable for providing the plurality of display panels DP-P may be performed. Thus, the process time may be reduced, and the process costs may be saved. However, the invention is not limited thereto. In an embodiment, one of the display panel DP may be provided from an initial substrate DP-I1 according to the size of the display panel DP.

As described above, the size of the second mask opening MKO2 defined in the second mask layer MK2 which is further from the target substrate SUB is greater than the size of the first mask opening MKO1 defined in the first mask layer MK1 which is closer to the target substrate SUB. During the deposition process using the mask MK, the failure, in which the deposition material DM is not deposited on a target area due to the second mask layer MK2, may be removed.

Also, the first mask opening MKO1 of the first mask layer MK1 may be provided or formed by the auxiliary layer AMK which is used during the mask-providing process. In this case, the degree of freedom in selecting the material of the second mask layer MK2 which is completely covered by the auxiliary layer AMK may increase. Also, the auxiliary layer AMK including the protruding tip portion overlapping the first mask opening MKO1 is completely removed, and thus, the deposition precision and deposition reliability may be improved upon the deposition process in which the mask MK is used.

Although the invention has been described with reference to the embodiments, it will be understood that various changes and modifications of the disclosure may be made by one ordinary skilled in the art or one having ordinary knowledge in the art without departing from the spirit and technical field of the disclosure as hereinafter claimed. Hence, the technical scope of the disclosure is not limited to the detailed description in the specification but should be determined only in accordance with the appended claims.

What is claimed is:

1. A method of providing a deposition mask, the method comprising:
   providing a first mask layer facing a second mask layer;
   in the second mask layer, providing a first opening which corresponds to a deposition opening of the deposition mask and exposes the first mask layer to outside the second mask layer;
   providing an auxiliary layer which faces the first mask layer with the second mask layer therebetween and covers the first opening in the second mask layer;
   in the auxiliary layer, providing a second opening which corresponds to the first opening and exposes the first mask layer to outside the auxiliary layer;
   in the first mask layer which is exposed to outside the auxiliary layer, providing a third opening which corresponds to the first opening and the second opening by using the auxiliary layer having the second opening as a mask; and
   providing the auxiliary layer separated from the first mask layer and the second mask layer to provide the deposition mask having the first mask layer having the third opening and the second mask layer having the first opening.

2. The method of claim 1, wherein in a plan view:
   each of the third opening in the first mask layer and the first opening in the second mask layer has a size, and
   the size of the third opening in the first mask layer is less than the size of the first opening in the second mask layer.

3. The method of claim 1, wherein
   each of the auxiliary layer and the second mask layer has a thickness, and
   the thickness of the auxiliary layer is greater than the thickness of the second mask layer.

4. The method of claim 1, wherein within the deposition mask having the first mask layer and the second mask layer, a portion of the first mask layer is exposed to outside the second mask layer through the first opening in the second mask layer.

5. The method of claim 1, wherein the providing of the first opening in the second mask layer comprises:
   providing a first photoresist layer on a preliminary second mask layer;
   providing a first exposure mask facing the first photoresist layer;
   providing a first photoresist pattern layer by patterning the first photoresist layer using the first exposure mask; and
   providing the first opening in the preliminary second mask layer by using the first photoresist pattern layer as a mask.

6. The method of claim 5, wherein the providing of the second opening in the auxiliary layer comprises:
   providing a second photoresist layer on the auxiliary layer;
   providing the first exposure mask facing the second photoresist layer;
   providing a second photoresist pattern layer by patterning the second photoresist layer using the first exposure mask; and
   providing the second opening in the auxiliary layer by using the second photoresist pattern layer as a mask.

7. The method of claim 5, wherein the providing of the second opening in the auxiliary layer comprises:
   providing a second photoresist layer on the auxiliary layer;
   providing a second exposure mask different from the first exposure mask facing the second photoresist layer;
   providing a second photoresist pattern layer by patterning the second photoresist layer using the second exposure mask; and
   providing the second opening in the auxiliary layer by using the second photoresist pattern layer as a mask,
   wherein
   the first exposure mask and the second exposure mask have a light transmitting area corresponding to the first opening and the second opening, respectively,
   the light transmitting area has a size, and
   a size of the light transmitting area of the first exposure mask is greater than a size of the light transmitting area of the second exposure mask.

8. The method of claim 1, wherein
   each of the second opening in the auxiliary layer and the first opening in the second mask layer has a maximum width, and
   the maximum width of the second opening in the auxiliary layer is less than the maximum width of the first opening in the second mask layer.

9. The method of claim 1, wherein
the second mask layer includes a side wall which defines the first opening and the first mask layer includes a side wall which defines the third opening, and
the side wall of the second mask layer surrounds the side wall of the first mask layer.

10. The method of claim 1, wherein
each of the second mask layer and the auxiliary layer includes a material, and
the material of the second mask layer is different from the material of auxiliary layer.

11. The method of claim 1, wherein
each of the providing of the first opening in the second mask layer and the providing of the second opening in the auxiliary layer uses an exposure mask, and
the exposure mask used in the providing of the first opening in the second mask layer is the same as the exposure mask used in the providing of the second opening in the auxiliary layer.

12. The method of claim 1, wherein
the second mask layer includes a side wall which defines the first opening, the auxiliary layer includes a side wall which defines the second opening and the first mask layer includes a side wall which defines the third opening, and
the side wall of the auxiliary layer is disposed further from the side wall of the second mask layer than a position corresponding to the side wall of the first mask layer.

13. The method of claim 1, wherein in a plan view of the deposition mask:
each of the first opening in the second mask layer, the second opening in the auxiliary layer and the third opening in the first mask layer has a size,
the size of the third opening in the first mask layer is equal to or less than the size of the first opening in the second mask layer, and
the size of the third opening in the first mask layer is greater than the size of the second opening in the auxiliary layer.

14. The method of claim 1, wherein
the second mask layer includes a side wall which defines the first opening, and
in the providing of the auxiliary layer, the side wall of the second mask layer is completely covered by the auxiliary layer.

15. A method of providing a display panel, the method comprising:
providing a deposition mask in which a deposition through-portion is defined corresponding to a light emitting pattern of the display panel;
providing the deposition mask facing a target substrate of the display panel which includes a light emitting area corresponding to the light emitting pattern;
providing the light emitting pattern on the light emitting area of the target substrate through the deposition through-portion of the deposition mask; and
providing the deposition mask separated from the target substrate having the light emitting pattern on the light emitting area,
wherein the providing of the deposition mask comprises:
providing a first mask layer facing a second mask layer of the deposition mask;
in the second mask layer, providing a first opening which corresponds to a deposition opening of the deposition mask and exposes the first mask layer to outside the second mask layer;
providing an auxiliary layer which faces the first mask layer with the second mask layer therebetween and covers the first opening in the second mask layer;
in the auxiliary layer, providing a second opening which corresponds to the first opening and exposes the first mask layer to outside the auxiliary layer;
in the first mask layer which is exposed to outside the auxiliary layer, providing a third opening which corresponds to the first opening and the second opening by using the auxiliary layer having the second opening as a mask; and
providing the auxiliary layer separated from the first mask layer and the second mask layer to provide the deposition mask having the first mask layer having the third opening and the second mask layer having the first opening,
wherein in a plan view:
each of the third opening in the first mask layer, the second opening in the auxiliary layer and the first opening in the second mask layer has a size,
the size of the third opening in the first mask layer is equal to or less than the size of the first opening in the second mask layer, and
the size of the third opening in the first mask layer is greater than the size of the second opening in the auxiliary layer.

16. The method of claim 15, wherein within the providing of the deposition mask:
each of the auxiliary layer and the second mask layer has a thickness, and
the thickness of the auxiliary layer is greater than the thickness of the second mask layer.

17. The method of claim 15, wherein within the providing of the deposition mask:
each of the providing of the first opening in the second mask layer and the providing of the second opening in the auxiliary layer uses an exposure mask, and
the exposure mask used in the providing of the first opening in the second mask layer is the same as the exposure mask used in the providing of the second opening in the auxiliary layer.

18. The method of claim 15, wherein the providing of the deposition mask facing the target substrate comprises disposing the target substrate facing the second mask layer with the first mask layer therebetween.

19. A deposition mask comprising:
a first mask layer comprising polyimide;
a first mask opening which is in the first mask layer and through which a deposition material exits the deposition mask;
a second mask layer which faces the first mask layer comprising polyimide and comprises titanium, titanium nitride or molybdenum; and
a second mask opening which is in the second mask layer, corresponds to the first mask opening and is larger than the first mask opening.

20. The deposition mask of claim 19, wherein each of the first mask layer and the second mask layer is a fluorine-etched layer.

* * * * *